(12) United States Patent  (10) Patent No.: US 11,579,186 B2
Lai  (45) Date of Patent: Feb. 14, 2023

(54) INTEGRATED CIRCUIT BURN-IN BOARD MANAGEMENT SYSTEM WITH EFFECTIVE BURN-IN BOARD SUSPENDING AND RELEASING MECHANISM

(71) Applicant: NANYA TECHNOLOGY CORPORATION, New Taipei (TW)

(72) Inventor: Cheng-Sung Lai, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 23 days.

(21) Appl. No.: 17/349,947

(22) Filed: Jun. 17, 2021

(65) Prior Publication Data

US 2022/0404415 A1   Dec. 22, 2022

(51) Int. Cl.
*G01R 31/28*  (2006.01)

(52) U.S. Cl.
CPC ..... *G01R 31/2863* (2013.01); *G01R 31/2817* (2013.01); *G01R 31/2849* (2013.01)

(58) Field of Classification Search
CPC ............ G01R 31/2863; G01R 31/2886; G01R 31/2893; G01R 1/0408; G01R 31/2867; G01R 31/2851; G01R 1/0466; G01R 1/0491; G01R 31/2865; G01R 31/2862; G01R 31/2877; G01R 31/2879; G01R 31/2875; G01R 31/2855; G01R 31/2868; G01R 31/287; G01R 31/2874; G01R 1/0483; G01R 31/28; G01R 31/2849; G01R 1/0458; G01R 19/25; G01R 31/00; G01R 31/2844; H01L 2924/14; H01L 22/00; H01L 21/67098; G06F 11/22; G06F 11/2289; G06F 11/267; G06F 11/00; G06F 11/0751; G06F 11/0766; G06F 1/20; G06F 11/1471; G06F 11/2273; G06F 2201/86; G06F 11/3065; G11C 11/40626; G11C 11/406; G11C 29/02; G11C 29/12;
(Continued)

(56) References Cited

U.S. PATENT DOCUMENTS 4,902,969 A * 2/1990 Gussman ............ G01R 31/2863
  324/750.05
5,093,982 A * 3/1992 Gussman ............ G01R 31/2867
  29/244
(Continued)

FOREIGN PATENT DOCUMENTS

WO  WO-2011086140 A1 * 7/2011 ......... G01R 31/2868

*Primary Examiner* — Vinh P Nguyen
(74) *Attorney, Agent, or Firm* — CKC & Partners Co., LLC

(57) ABSTRACT

A burn-in board management system includes a production burn-in apparatus and a burn-in board status computer. The production burn-in apparatus is configured to test a plurality of integrated circuit devices mounted in slots of a burn-in board and comprising a first controller configured to generate a first burn-in board status map, wherein the first controller is further configured to suspend the burn-in board when the first burn-in board status map of the burn-in board demonstrates that more than a threshold percentage of the slots of the burn-in board are determined to be malfunctioned. The burn-in board status computer is communicably connected with the first controller of the production burn-in apparatus and configured to receive the first burn-in board status map.

16 Claims, 6 Drawing Sheets

(58) Field of Classification Search
CPC ............ G05B 19/4183; G05B 19/4184; G05B 2219/35001; G05B 17/02; G01N 27/9046
See application file for complete search history.

(56) References Cited

U.S. PATENT DOCUMENTS

| | | | | |
|---|---|---|---|---|
| 5,509,193 | A * | 4/1996 | Nuxoll | H05K 13/0406 29/760 |
| 6,160,411 | A * | 12/2000 | Eliashberg | G01R 31/2863 324/750.05 |
| 6,473,895 | B1 * | 10/2002 | Lopes | G06F 8/316 717/114 |
| 6,580,283 | B1 * | 6/2003 | Carbone | G01R 31/2886 324/750.19 |
| 6,788,083 | B1 * | 9/2004 | Siddiqui | G01R 31/2863 324/750.05 |
| 7,038,479 | B1 * | 5/2006 | Siddiqui | G01R 31/2863 324/750.05 |

* cited by examiner

Fig. 4

|   | P | O | N | M | L | K | J | I | H | G | F | E | D | C | B | A |
|---|---|---|---|---|---|---|---|---|---|---|---|---|---|---|---|---|
| P | O | X | O | O | O | O | O | O | O | O | O | O | O | O | O | O |
| O | O | X | O | O | O | O | O | O | O | O | O | O | O | O | O | O |
| N | O | O | O | O | O | O | O | O | O | O | O | O | O | O | O | O |
| M | O | O | O | O | O | O | O | O | O | O | O | O | O | O | O | O |
| L | O | O | O | O | O | O | O | O | O | O | O | O | O | O | O | O |
| K | O | X | O | O | O | O | O | O | O | O | O | O | O | O | O | O |
| J | O | O | O | O | O | O | O | O | O | O | O | O | O | O | O | O |
| I | O | O | O | X | O | O | O | O | O | O | O | O | O | O | O | O |
| H | O | O | O | O | O | O | O | O | O | O | O | O | O | O | O | O |
| G | O | O | O | O | O | O | O | O | O | O | O | O | O | O | O | O |
| F | O | X | O | O | O | O | O | O | O | O | O | O | O | O | O | O |
| E | O | O | O | O | O | O | O | O | O | O | X | O | O | O | O | O |
| D | O | O | O | O | O | O | O | O | O | O | O | O | O | O | O | O |
| C | O | O | O | O | O | O | O | O | O | O | O | O | O | O | O | O |
| B | O | X | O | O | O | O | O | O | O | X | O | O | O | O | O | O |
| A | O | O | O | O | O | O | O | O | O | O | O | O | O | O | O | O |

INTEGRATED CIRCUIT BURN-IN BOARD MANAGEMENT SYSTEM WITH EFFECTIVE BURN-IN BOARD SUSPENDING AND RELEASING MECHANISM

BACKGROUND

Field of Disclosure

The present disclosure relates to a management system, and more particularly to an integrated circuit burn-in board management system.

Description of Related Art

When producing semiconductors, manufacturers typically perform three different tests on the semiconductors prior to shipping: (1) sort, (2) burn-in, and (3) class testing. Sort test requires maintaining the wafers at a modest temperature while the wafers are probed for defects.

Burn-in of the semiconductors is typically accomplished utilizing elevated voltages and temperatures in a process that raises the junction temperatures of a batch of semiconductors. The lifespan of a semiconductor is closely related to its operating temperature wherein operating under increased temperatures reduces the effective lifespan of the semiconductor. By applying increased voltages and temperatures to a semiconductor, the weaker semiconductors will fail during testing. Class test is the final step in the testing process and is comprised of a final series of tests to validate functionality and quantify speeds.

A burn-in apparatus for semiconductor devices is generally known in which a multiplicity of devices are mounted on burn-in boards, the boards are stacked in multiple stages in a temperature controlled chamber, electric current is passed through the devices, hot air with a temperature adjusted to the prescribed temperature, for example 125° C., is caused to flow parallel to the burn-in boards inside the chamber and circulate.

The burn-in board is an interface board having slots allowing semiconductor devices mounted thereon and transferring electric current passed through the devices via its connectors. A part of slots and connectors of the burn-in board may be damaged or malfunctioned during burn-in process and could not allow semiconductor devices mounted thereon to execute burn-in process. A proper management system to maintain these burn-in boards would facilitate a high efficiency of the burn-in process.

SUMMARY

The present disclosure provides a test apparatus configured to test a device under test to deal with the needs of the prior art problems.

In one or more embodiments, a burn-in board management system includes a production burn-in apparatus and a burn-in board status computer. The production burn-in apparatus is configured to test a plurality of integrated circuit devices mounted in slots of a burn-in board and comprising a first controller configured to generate a first burn-in board status map of the burn-in board, wherein the first controller is further configured to suspend the burn-in board when the first burn-in board status map of the burn-in board demonstrates that more than a threshold percentage of the slots of the burn-in board are determined to be malfunctioned. The burn-in board status computer is communicably connected with the first controller of the production burn-in apparatus and configured to receive the first burn-in board status map.

In one or more embodiments, the first controller is configured to generate the first burn-in board status map of the burn-in board according to tested results of the integrated circuit devices.

In one or more embodiments, the burn-in board management system further includes a burn-in board verification apparatus configured to test malfunctioned ones of the slots of the suspended burn-in board by mounting qualified-passed integrated circuit devices in the malfunctioned ones of the slots, and the burn-in board verification apparatus includes a second controller configured to generate a second burn-in board status map of the burn-in board.

In one or more embodiments, the burn-in board verification apparatus is communicably connected with the burn-in board status computer and configured to receive the first burn-in board status map to identify the malfunctioned ones of the slots of the suspended burn-in board.

In one or more embodiments, the burn-in board status computer is communicably connected with the second controller of the burn-in board verification apparatus to receive the second burn-in board status map to update the first burn-in board status map.

In one or more embodiments, the second controller is configured to generate the second burn-in board status map of the suspended burn-in board according to tested results of the qualified-passed integrated circuit devices.

In one or more embodiments, the burn-in board status computer includes a storage media to store the first burn-in board status map.

In one or more embodiments, the burn-in board status computer includes a processor configured to receive the second burn-in board status map to update the first burn-in board status map.

In one or more embodiments, the burn-in board status computer includes a processor configured to release the suspended burn-in board when the updated first burn-in board status map of the suspended burn-in board demonstrates that less than the threshold percentage of the slots of the burn-in board are determined to be malfunctioned.

In one or more embodiments, the first controller of the production burn-in apparatus is further configured to receive the updated first burn-in board status map of the released burn-in board from the burn-in board status computer to execute a test by using the released burn-in board.

In one or more embodiments, a burn-in board management system includes a burn-in board status computer and a burn-in board verification apparatus. The burn-in board status computer has a storage media to store a first burn-in board status map of a suspended burn-in board. The burn-in board verification apparatus is configured to test malfunctioned slots of the suspended burn-in board by mounting qualified-passed integrated circuit devices in the malfunctioned slots, and the burn-in board verification apparatus includes a controller configured to generate a second burn-in board status map of the suspended burn-in board.

In one or more embodiments, the burn-in board status computer is communicably connected with the controller of the burn-in board verification apparatus to receive the second burn-in board status map to update the first burn-in board status map.

In one or more embodiments, the burn-in board status computer includes a processor configured to receive the second burn-in board status map to update the first burn-in board status map.

In one or more embodiments, the burn-in board status computer includes a processor configured to release the suspended burn-in board when the updated first burn-in board status map of the suspended burn-in board demonstrates that less than a threshold percentage of the slots of the suspended burn-in board are determined to be malfunctioned.

In one or more embodiments, the controller is configured to generate the second burn-in board status map of the suspended burn-in board according to tested results of the qualified-passed integrated circuit devices.

In one or more embodiments, the burn-in board management system further includes a production burn-in apparatus communicably connected with the burn-in board status computer, and the production burn-in apparatus is configured to receive the updated first burn-in board status map of the released burn-in board and use the released burn-in board to execute a test.

In one or more embodiments, the burn-in board verification apparatus is communicably connected with the burn-in board status computer and configured to receive the first burn-in board status map to identify the malfunctioned slots of the suspended burn-in board.

In sum, the burn-in board management system disclosed herein provides an effective mechanism to manage huge amounts of burn-in boards and to reduce manual operation errors and costs on burn-in board management.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIG. 4 illustrates another burn-in board status map according to some embodiments of the present disclosure;

FIG. 5 illustrates still another burn-in board status map according to some embodiments of the present disclosure.

DETAILED DESCRIPTION

Figure 1:
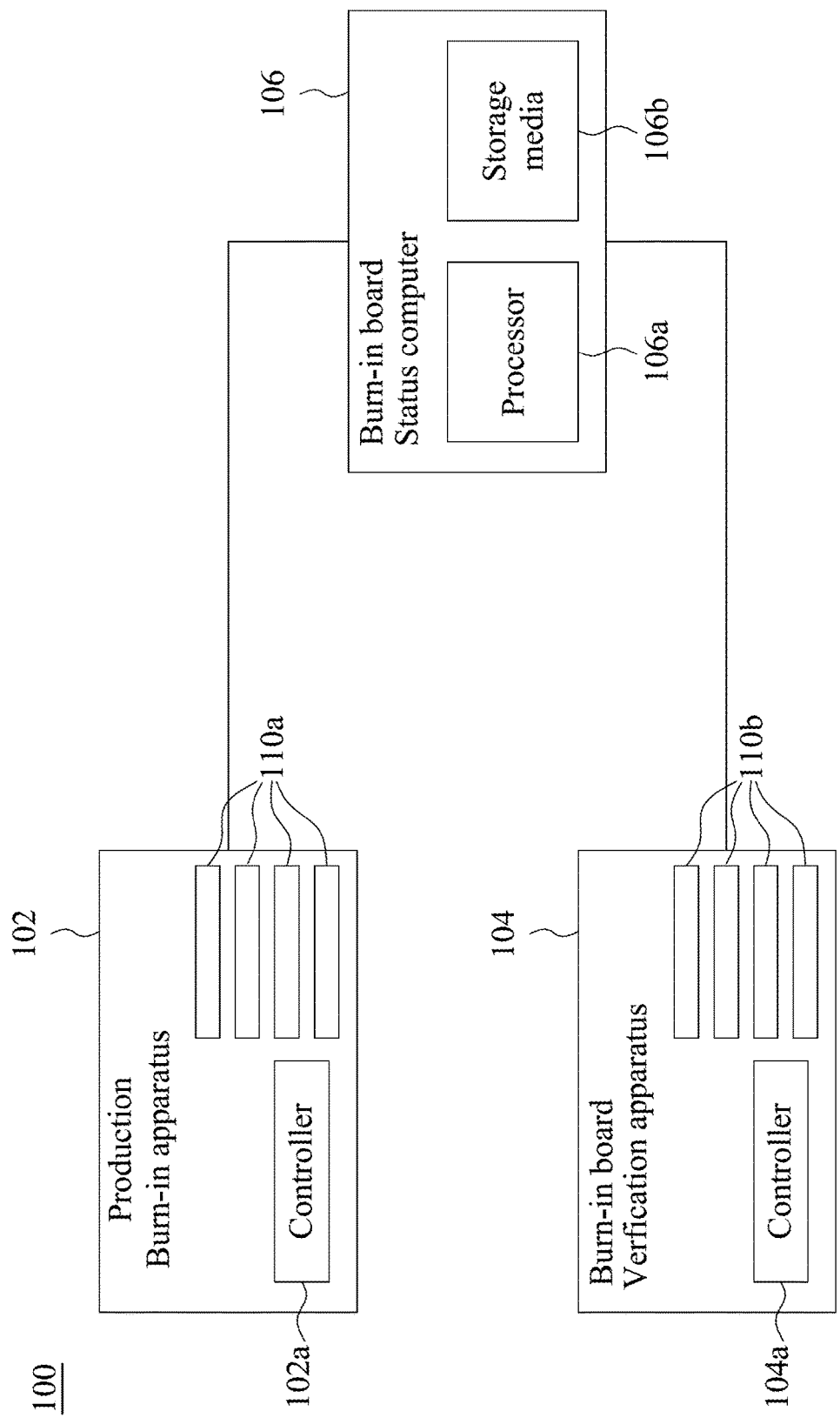
FIG. 1 illustrates a configuration of a burn-in board management system according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

Reference is made to FIG. 1, which illustrates a configuration of a burn-in board management system 100 according to some embodiments of the present disclosure. The burn-in board management system 100 may include a production burn-in apparatus 102, a burn-in board status computer 106 and/or a burn-in board verification apparatus 104. The production burn-in apparatus 102 may include a heater and a cooler to control a testing environment and an electricity tester to execute tests with increased voltages and temperatures to semiconductor integrated circuit devices so as to sort out weaker semiconductor integrated circuit devices that fail during testing. The electricity tester of the production burn-in apparatus 102 is configured to execute burn-in tests to the semiconductor integrated circuit devices via burn-in boards, e.g., burn-in boards 110a. The production burn-in apparatus 102 may include a controller 102a to generate a testing data or result of the semiconductor integrated circuit devices after a burn-in test is executed. The burn-in board status computer 106 is communicably connected with the production burn-in apparatus 102, e.g., the controller 102a, to receive burn-in board data associated with the testing data or result of the semiconductor integrated circuit devices. Burn-in boards are also under increased voltages and temperatures along with the semiconductor integrated circuit devices during testing and may be damaged or malfunctioned in some portions. The burn-in board verification apparatus 104 is configured to reconfirm damaged or malfunctioned portions of the burn-in board, e.g., burn-in board 110b, by a test similar to the burn-in tests, to decide whether or not to repair the burn-in board or release the burn-in board to the production burn-in apparatus 102.

Figure 2:
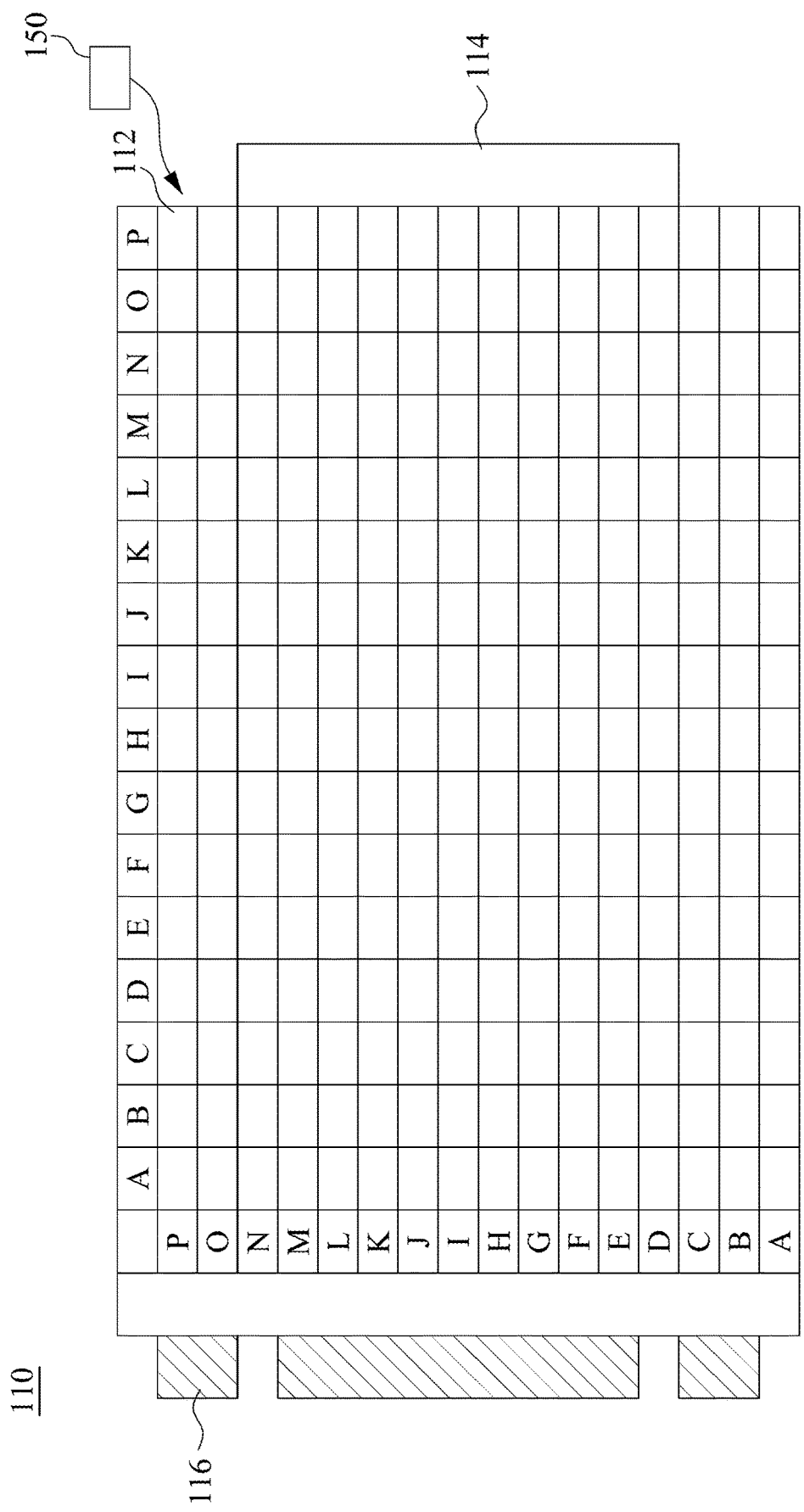
FIG. 2 illustrates a burn-in board according to some embodiments of the present disclosure.
Figure 3:
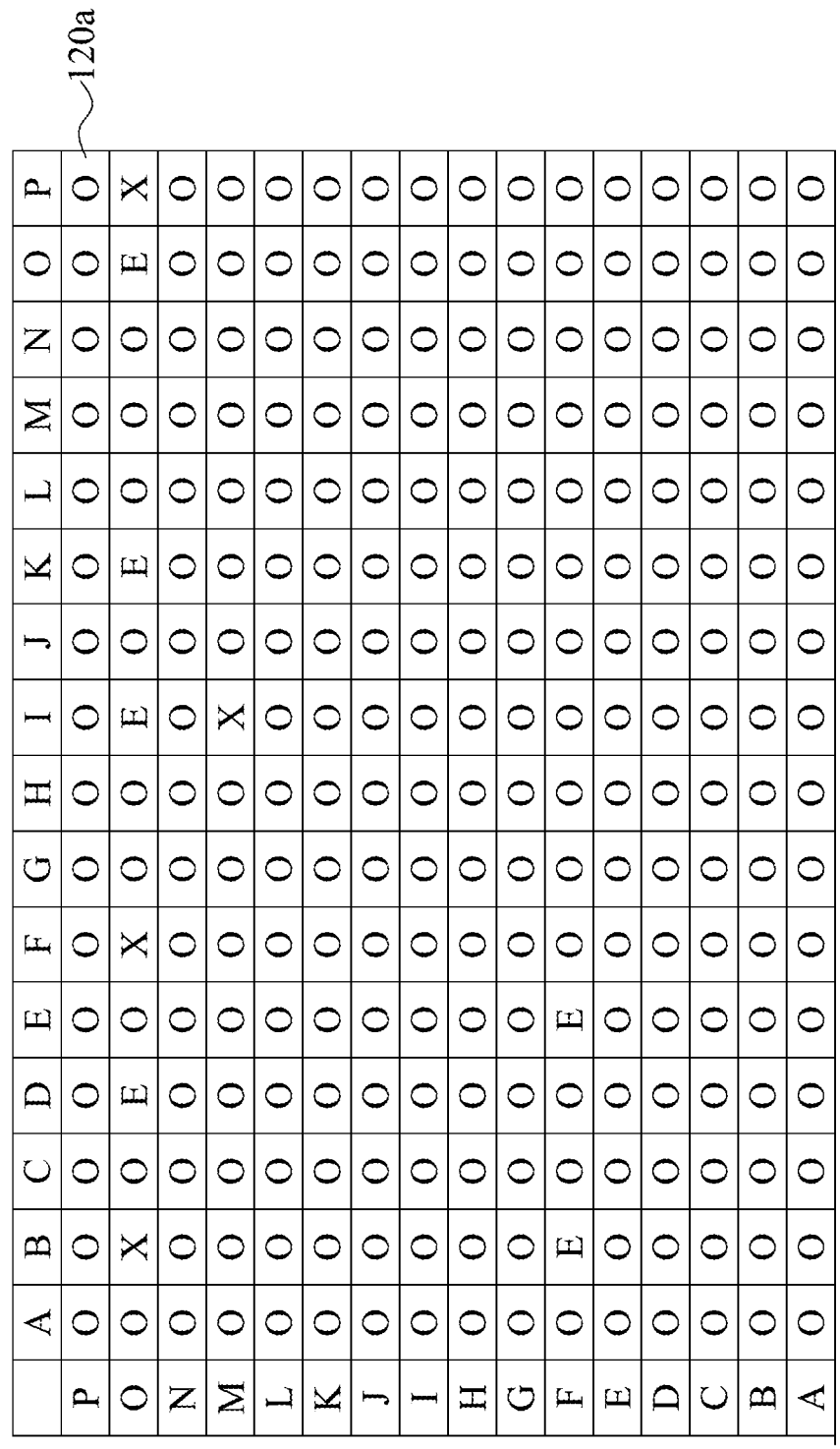
FIG. 3 illustrates a burn-in board status map according to some embodiments of the present disclosure.
Figure 6:
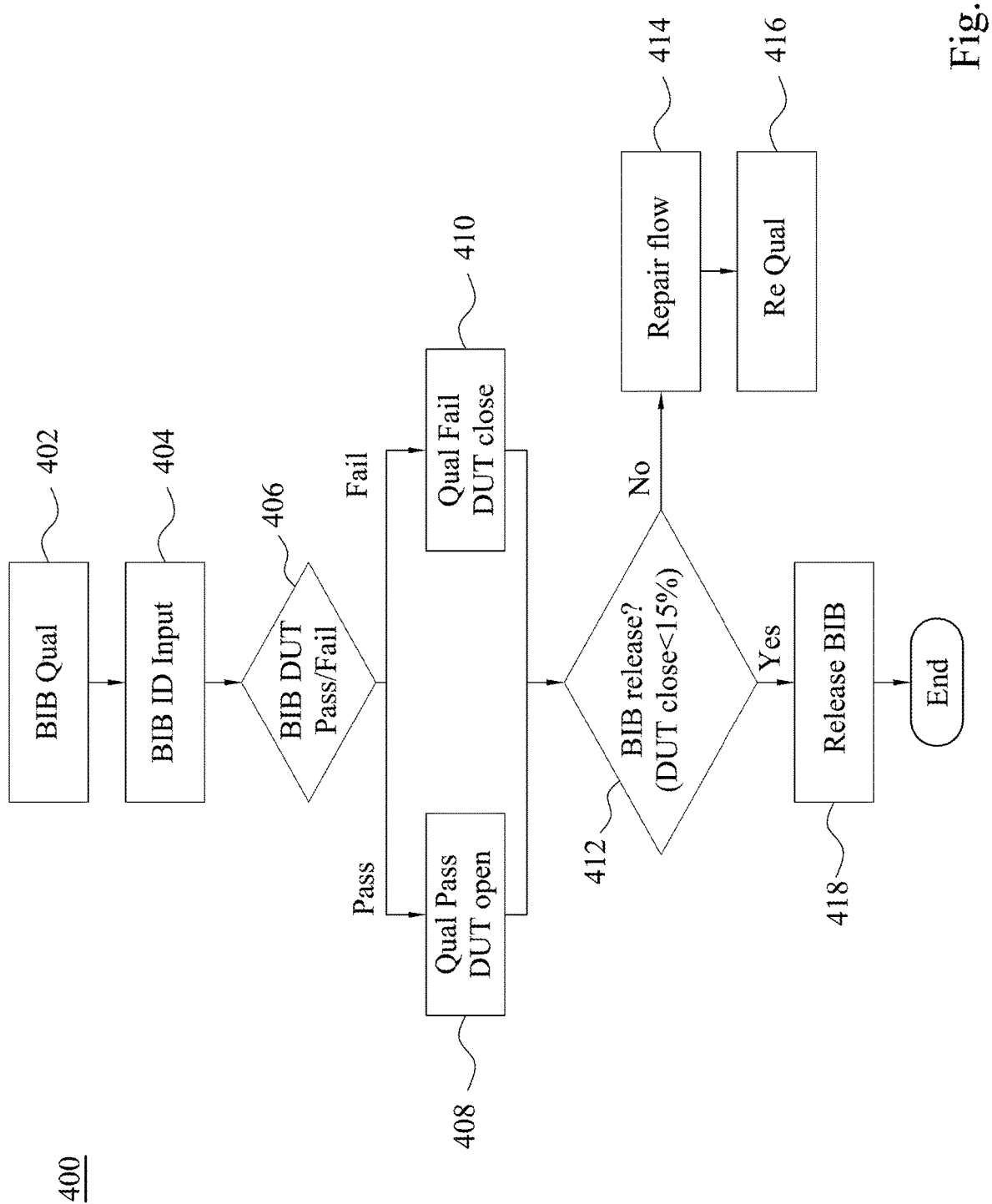
FIG. 6 illustrates a flowchart of a burn-in board management system according to some embodiments of the present disclosure.

Reference is made to FIGS. 1 and 2, and FIG. 2 illustrates a burn-in board 100 according to some embodiments of the present disclosure. The burn-in board 100 may include a plurality of slots 112 on a board body, gold fingers 116 and a handle 114 that are located at two opposite ends of the board body. The gold fingers 116 are configured to engage corresponding electrical connectors of the production burn-in apparatus 102 or the burn-in board verification apparatus 104 to achieve electrical connection during burn-in testing. The handle 114 allows an operator, e.g., a human hand or a robot arm, to grab and thus pull out the burn-in board 100 from the corresponding connectors or insert the burn-in board 100 into the corresponding connectors of the production burn-in apparatus 102 or the burn-in board verification apparatus 104. Each slot 112 is configured to receive or accommodate a semiconductor integrated circuit device 150 and has an electrical connector to engage a corresponding electrical connector of the semiconductor integrated circuit device 150.

In some embodiments of the present disclosure, the semiconductor integrated circuit device 150 may be an integrated circuit device that is packaged after an assembling process. In some embodiments of the present disclosure, the semiconductor integrated circuit device 150 may be a memory integrated circuit device that is packaged after an assembling process. In some embodiments of the present disclosure, the semiconductor integrated circuit device 150 may be a double data rate synchronous dynamic random-access memory device. In some embodiments of the present disclosure, the semiconductor integrated circuit device 150 may be a low power double data rate synchronous dynamic random-access memory device.

Figure 4:
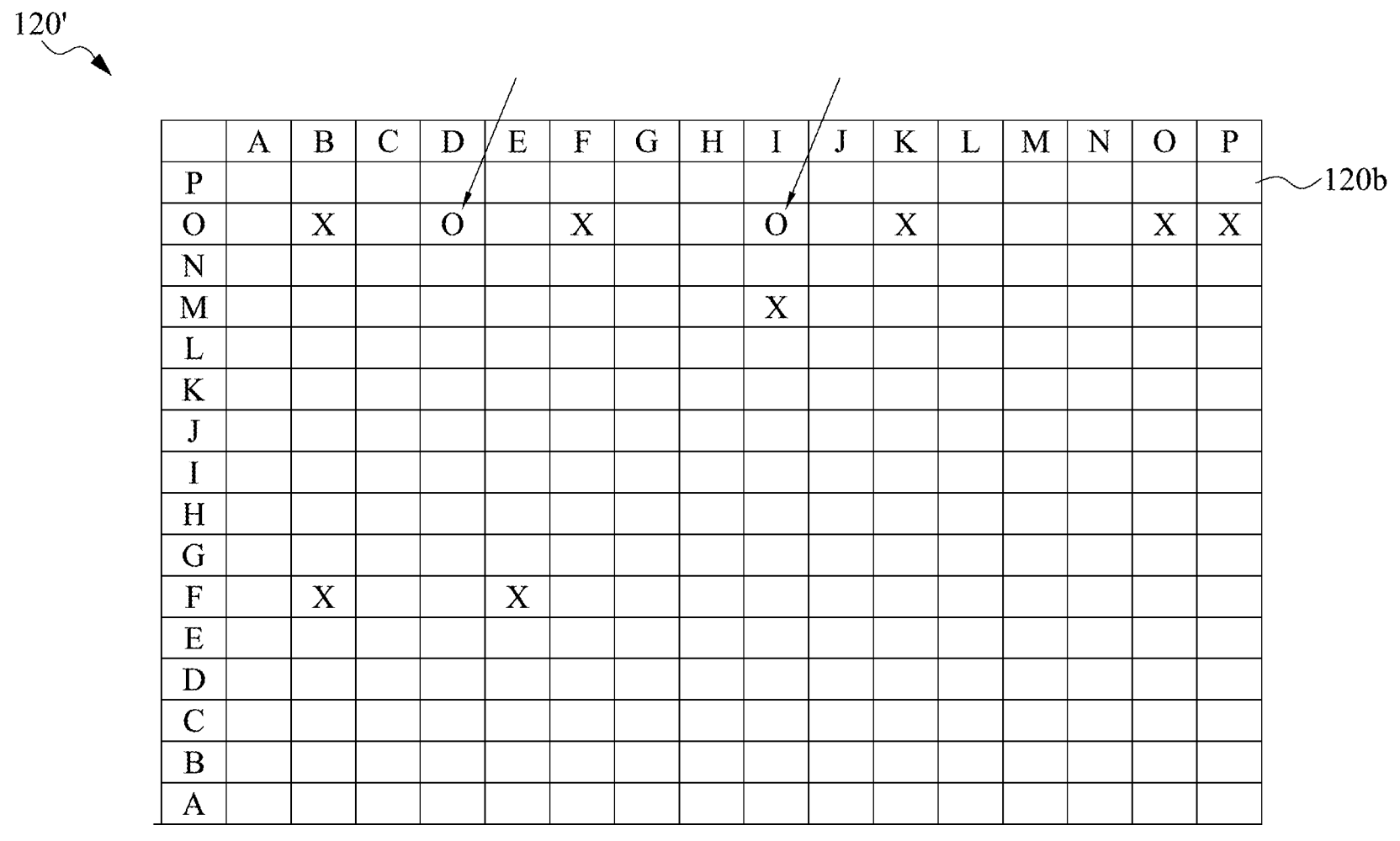

Reference is made to FIGS. 1-5, FIG. 3 illustrates a burn-in board status map 120 according to some embodiments of the present disclosure, FIG. 4 illustrates another burn-in board status map 120' according to some embodiments of the present disclosure, and FIG. 5 illustrates still another burn-in board status map 120" according to some embodiments of the present disclosure.

The burn-in board status map 120 is associated with the testing data or result generated by the controller 102a of the production burn-in apparatus 102 after a burn-in test is executed. In particular, the controller 102a generates the burn-in board status map 120 of the burn-in board 110*a* according to tested results of the integrated circuit devices. The burn-in board status map 120 includes status for a plurality of DUT (devices under test) 120*a*. The DUTs 120*a* in the burn-in board status map 120 should have one-on-one relationship to slots 112 of an associated burn-in board, e.g., the burn-in board 110, such that a status of each slot 112 can be demonstrated. The "O" character labeled on DUTs 120*a* in the burn-in board status map 120 represent a "normal" status of a corresponding slot 112. The slots 112 with the "normal" status allow the semiconductor integrated circuit devices 150 to be mounted and the burn-in test can be executed. The "X" character labeled on DUTs 120*a* in the burn-in board status map 120 represent a "lock" status of a corresponding slot 112. The slots 112 with the "lock" status do not allow the semiconductor integrated circuit devices 150 to be mounted for the burn-in test. The "E" character labeled on DUTs 120*a* in the burn-in board status map 120 represent a "abnormal" status of a corresponding slot 112. The DUT 120*a* is labeled with the "abnormal" status after the DUT 120*a* fails continuously more than a threshold number, e.g., three times, in series of burn-in tests. Similarly, the slot 112 with the "abnormal" status does not allow the semiconductor integrated circuit device 150 to be mounted for further burn-in tests after its corresponding DUT 120*a* in the burn-in board status map 120 achieve the threshold numbers of continuously failing. The controller 102*a* of the production burn-in apparatus 102 is further configured to suspend the burn-in board when the burn-in board status map of the burn-in board demonstrates that more than a threshold percentage of the slots of the burn-in board are determined to be malfunctioned. The slots 112 of the burn-in board 110 with the "abnormal" status or the "lock" status are determined to be malfunctioned. In some embodiments of the present disclosure, the controller 102*a* of the production burn-in apparatus 102 will suspend a burn-in board when more than 15 percentages of the slots of the burn-in board are determined to be malfunctioned. A suspended burn-in board is not allowed to insert into the production burn-in apparatus 102 or mount semiconductor integrated circuit devices 150 thereon for further burn-in tests.

The burn-in board status computer 106 is communicably connected with the controller 102*a* of the production burn-in apparatus 102 and configured to receive the burn-in board status map 120 generated by the controller 102*a* of the production burn-in apparatus 102. In some embodiments of the present disclosure, the burn-in board status computer 106 has a storage media 106*b* to store the burn-in board status map 120. In some embodiments of the present disclosure, the storage media 106*b* can be a read only memory (ROM) or a non-volatile storage device (such as flash memory or a hard disk), but not being limited thereto.

The burn-in board status map 120' is associated with the testing data or result generated by the controller 104*a* of the burn-in board verification apparatus 104 after a test is executed on the malfunctioned ones of the slots 112 of the suspended burn-in board, e.g., the burn-in board 110*b*. That is, the slots 112 of the burn-in board 110*a* with the "abnormal" status or the "lock" status needs to be tested by the burn-in board verification apparatus 104, and no test is executed on other slots 112 of the burn-in board 110*a* with the "normal" status. Before the test is executed, the burn-in board verification apparatus 104 is communicably connected with the burn-in board status computer 106 to receive the burn-in board status map 120 such that the malfunctioned ones of the slots 112 of the suspended burn-in board can be identified. The malfunctioned ones of the slots 112 of the suspended burn-in board are mounted with qualified-passed integrated circuit devices when the test is executed on the burn-in board verification apparatus 104. Since the qualified-passed integrated circuit devices are tested-passed devices, the tested results of the qualified-passed integrated circuit devices directly demonstrate the status of the malfunctioned ones of the slots 112 of the suspended burn-in board. The controller 104*a* generates the burn-in board status map 120' of the burn-in board 110*b* according to tested results of the qualified-passed integrated circuit devices mounted in the malfunctioned ones of the slots 112 of the suspended burn-in board. The burn-in board status map 120' includes DUT status. The DUTs 120*b* in the burn-in board status map 120 should have one-on-one relationship to slots 112 of an associated burn-in board, e.g., the burn-in board 110, such that a status of each slot 112 can be demonstrated. Similarly, the "O" character labeled on DUTs 120*b* in the burn-in board status map 120' represents a "normal" status of a corresponding slot 112. The "X" character labeled on DUTs 120*b* in the burn-in board status map 120 represents a "lock" status of a corresponding slot 112. The slot 112 with the "lock" status does not allow the semiconductor integrated circuit device 150 to be mounted for the burn-in test. No "E" character is labeled on DUTs 120*b* in the burn-in board status map 120'.

The burn-in board status computer 106 is communicably connected with the controller 104*a* of the burn-in board verification apparatus 104 and configured to receive the burn-in board status map 120' generated by the controller 104*a* of the burn-in board verification apparatus 104. In some embodiments of the present disclosure, the burn-in board status computer 106 includes a processor 106*a* configured to receive the burn-in board status map 120' to update the burn-in board status map 120. For example, after the test is executed on the suspended burn-in board, the burn-in board status map 120' demonstrates that two "abnormal" status (e.g., indicated by two arrows) should be released and labeled with "O" character, and other "abnormal" status are maintained and labeled with "X" character. That is, the updated burn-in board status map 120' is the burn-in board status map 120" in FIG. 5. In some embodiments of the present disclosure, the burn-in board status computer 106 includes the processor 106*a* configured to release the suspended burn-in board when the updated burn-in board status map, e.g., 120", of the suspended burn-in board demonstrates that less than a threshold percentage of the slots 112 of the burn-in board are determined to be malfunctioned. In some embodiments of the present disclosure, the processor 106*a* of the burn-in board status computer 106 will release a suspended burn-in board when less than 15 percentages of the slots of the burn-in board are determined to be malfunctioned. A released burn-in board is allowed to insert into the production burn-in apparatus 102 and mount semiconductor integrated circuit devices 150 thereon for further burn-in tests.

The production burn-in apparatus 102 is communicably connected with the burn-in board status computer 106 and configured to receive the updated burn-in board status map 120" of the released burn-in board 110*a* and use the released burn-in board 110*a* to execute a burn-in test.

Reference is made to FIGS. 1-6, and FIG. 6 illustrates a flowchart 400 of a burn-in board management system 100 according to some embodiments of the present disclosure. The flowchart 400 includes an operation 402 in which a qualification or verification process for a burn-in board (BIB) is started, for example, in the burn-in board verification apparatus 104. In an operation 404, a burn-in board ID is input by, for example, scanning a barcode of a suspended burn-in board 110b. In an operation 406, the burn-in board verification apparatus 104 is communicably connected with the burn-in board status computer 106 to receive the burn-in board status map 120 such that the malfunctioned ones of the slots 112 of the suspended burn-in board can be identified. And then a test is executed on the malfunctioned ones of the slots 112 of the suspended burn-in board, e.g., the burn-in board 110b. The controller 104a of the burn-in board verification apparatus 104 generates the burn-in board status map 120' of the burn-in board 110b according to tested results of the qualified-passed integrated circuit devices mounted in the malfunctioned ones of the slots 112 of the suspended burn-in board 110b. In an operation 408, when the malfunctioned ones of the slots 112 is tested passed or qualified passed, the corresponding DUT the burn-in board status map 120' will be labeled with the "O" character. In an operation 410, when the malfunctioned ones of the slots 112 is tested failed or qualified failed, the corresponding DUT the burn-in board status map 120' will be labeled with the "X" character. In an operation 412, the burn-in board status computer 106 receives the burn-in board status map 120' to update the burn-in board status map 120 to obtain the updated burn-in board status map 120". In an operation 418, the burn-in board status computer 106 will release the suspended burn-in board when the updated burn-in board status map 120" of the suspended burn-in board demonstrates that less than a threshold percentage, e.g., 15%, of the slots 112 of the suspended burn-in board are determined to be malfunctioned. In an operation 414, the burn-in board status computer 106 will send the suspended burn-in board for repairing when the updated burn-in board status map 120" of the suspended burn-in board demonstrates that more than a threshold percentage, e.g., 15%, of the slots 112 of the burn-in board are determined to be malfunctioned. In an operation 416, a requalification process will be backed to the operation 402 after the suspended burn-in board is repaired.

In sum, the burn-in board management system disclosed herein provides an effective mechanism to manage huge amounts of burn-in boards and to reduce manual operation errors and costs on burn-in board management.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A burn-in board management system comprising:
a production burn-in apparatus configured to test a plurality of integrated circuit devices mounted in slots of a burn-in board and comprising a first controller configured to generate a first burn-in board status map of the burn-in board, wherein the first controller is further configured to suspend the burn-in board when the first burn-in board status map of the burn-in board demonstrates that more than a threshold percentage of the slots of the burn-in board are determined to be malfunctioned; and a burn-in board status computer communicably connected with the first controller of the production burn-in apparatus and configured to receive the first burn-in board status map.

2. The burn-in board management system of claim 1, wherein the first controller is configured to generate the first burn-in board status map of the burn-in board according to tested results of the integrated circuit devices.

3. The burn-in board management system of claim 1, further comprising a burn-in board verification apparatus configured to test malfunctioned ones of the slots of the suspended burn-in board by mounting qualified-passed integrated circuit devices in the malfunctioned ones of the slots, and the burn-in board verification apparatus comprising a second controller configured to generate a second burn-in board status map of the burn-in board.

4. The burn-in board management system of claim 3, wherein the burn-in board verification apparatus is communicably connected with the burn-in board status computer and configured to receive the first burn-in board status map to identify the malfunctioned ones of the slots of the suspended burn-in board.

5. The burn-in board management system of claim 3, wherein the burn-in board status computer is communicably connected with the second controller of the burn-in board verification apparatus to receive the second burn-in board status map to update the first burn-in board status map.

6. The burn-in board management system of claim 5, wherein the burn-in board status computer comprises a processor configured to receive the second burn-in board status map to update the first burn-in board status map.

7. The burn-in board management system of claim 5, wherein the burn-in board status computer comprises a processor configured to release the suspended burn-in board when the updated first burn-in board status map of the suspended burn-in board demonstrates that less than the threshold percentage of the slots of the burn-in board are determined to be malfunctioned.

8. The burn-in board management system of claim 7, wherein the first controller of the production burn-in apparatus is further configured to receive the updated first burn-in board status map of the released burn-in board from the burn-in board status computer to execute a test by using the released burn-in board.

9. The burn-in board management system of claim 3, wherein the second controller is configured to generate the second burn-in board status map of the suspended burn-in board according to tested results of the qualified-passed integrated circuit devices.

10. The burn-in board management system of claim 1, wherein the burn-in board status computer comprises a storage media to store the first burn-in board status map.

11. A burn-in board management system comprising:
a production burn-in apparatus configured to test a plurality of integrated circuit devices mounted in slots of a burn-in board and comprising a first controller configured to generate a first burn-in board status map of the burn-in board, wherein the first controller is further configured to suspend the burn-in board when the first burn-in board status map of the burn-in board demonstrates that more than a threshold percentage of the slots of the burn-in board are determined to be malfunctioned;
a burn-in board status computer having a storage media to store nail the first burn-in board status map of the suspended burn-in board; and a burn-in board verification apparatus configured to test malfunctioned slots of the suspended burn-in board by mounting qualified-passed integrated circuit devices in the malfunctioned slots, and the burn-in board verification apparatus comprising a second controller configured to generate a second burn-in board status map of the suspended burn-in board according to tested results of the qualified-passed integrated circuit devices mounted in the malfunctioned slots.

12. The burn-in board management system of claim 11, wherein the burn-in board status computer is communicably connected with the second controller of the burn-in board verification apparatus to receive the second burn-in board status map to update the first burn-in board status map.

13. The burn-in board management system of claim 12, wherein the burn-in board status computer comprises a processor configured to receive the second burn-in board status map to update the first burn-in board status map.

14. The burn-in board management system of claim 12, wherein the burn-in board status computer comprises a processor configured to release the suspended burn-in board when the updated first burn-in board status map of the suspended burn-in board demonstrates that less than a threshold percentage of the slots of the suspended burn-in board are determined to be malfunctioned.

15. The burn-in board management system of claim 14, further comprising a production burn-in apparatus communicably connected with the burn-in board status computer, the production burn-in apparatus configured to receive the updated first burn-in board status map of the released burn-in board and use the released burn-in board to execute a test.

16. The burn-in board management system of claim 11, wherein the burn-in board verification apparatus is communicably connected with the burn-in board status computer and configured to receive the first burn-in board status map to identify the malfunctioned slots of the suspended burn-in board.

* * * * *